United States Patent [19]

Saia et al.

[11] Patent Number: 5,318,664
[45] Date of Patent: Jun. 7, 1994

[54] PATTERNING OF INDIUM-TIN OXIDE VIA SELECTIVE REACTIVE ION ETCHING

[75] Inventors: Richard J. Saia; Robert F. Kwasnick; Ching-Yeu Wei, all of Schenectady, N.Y.

[73] Assignee: General Electric Company, Schenectady, N.Y.

[21] Appl. No.: 791,715

[22] Filed: Nov. 14, 1991

Related U.S. Application Data

[63] Continuation-in-part of Ser. No. 542,624, Jun. 25, 1990, abandoned.

[51] Int. Cl.$^5$ .............................................. H05H 1/00
[52] U.S. Cl. .................................... 156/643; 156/646; 156/656; 156/667
[58] Field of Search ............... 156/667, 664, 643, 646, 156/656

[56] References Cited

U.S. PATENT DOCUMENTS

| | | | |
|---|---|---|---|
| 4,256,534 | 3/1981 | Levinstein et al. | 156/643 |
| 4,878,993 | 11/1989 | Rossi et al. | 156/643 |
| 4,892,613 | 1/1990 | Motai et al. | 156/643 |
| 5,032,221 | 7/1991 | Roselle et al. | 156/643 |
| 5,079,178 | 1/1992 | Chouan et al. | 156/643 X |

OTHER PUBLICATIONS

"Selective Reactive Ion Etching of Indium-Tin Oxide in a Hydrocarbon Gas Mixture", R. J. Saia et al., Journal of the Electrochemical Society, vol. 138, No. 2, Feb. 1991 pp. 493–496.

*Primary Examiner*—Thi Dang
*Attorney, Agent, or Firm*—Donald S. Ingraham; Marvin Snyder

[57] ABSTRACT

Indium-tin oxide is selective etched relative to silicon, molybdenum, aluminum, titanium, silicon oxide and silicon nitride using an organic radical and oxygen containing plasma which contains sufficient oxygen to prevent deposition of undesirable films on non-etching portions of the component being etched and on the reactor surfaces. The plasma lacks halogenated gases. A minimum differential etch rate of 8:1 of indium-tin oxide to silicon results with the other materials etching slower than silicon or not at all.

37 Claims, 4 Drawing Sheets

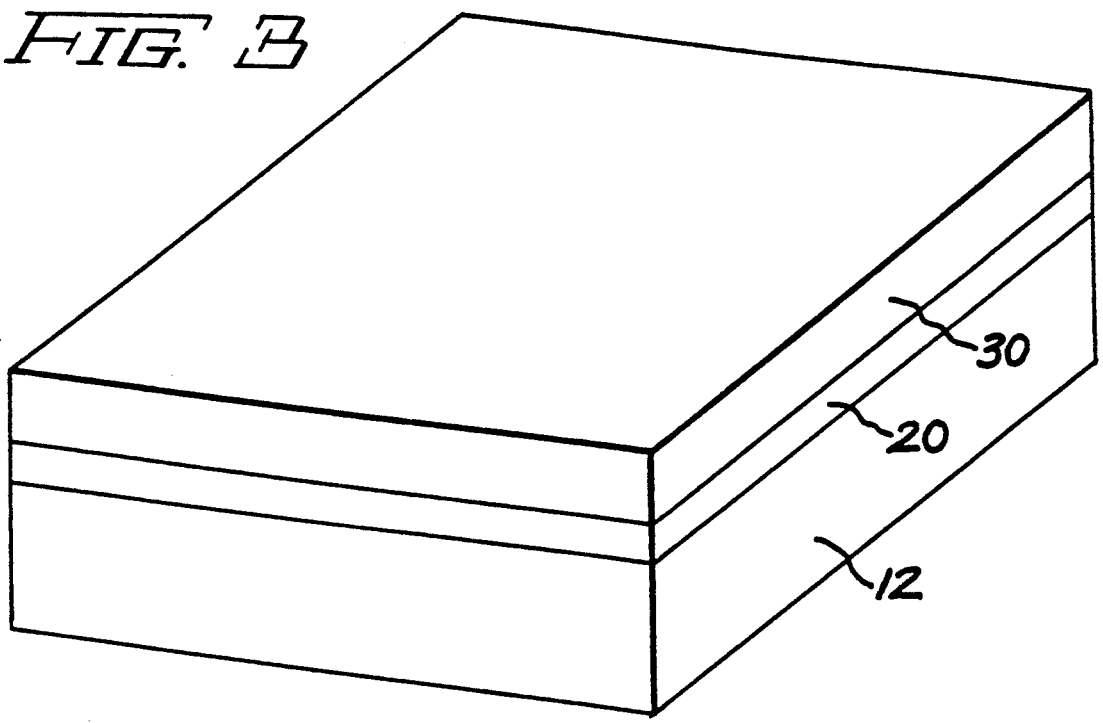
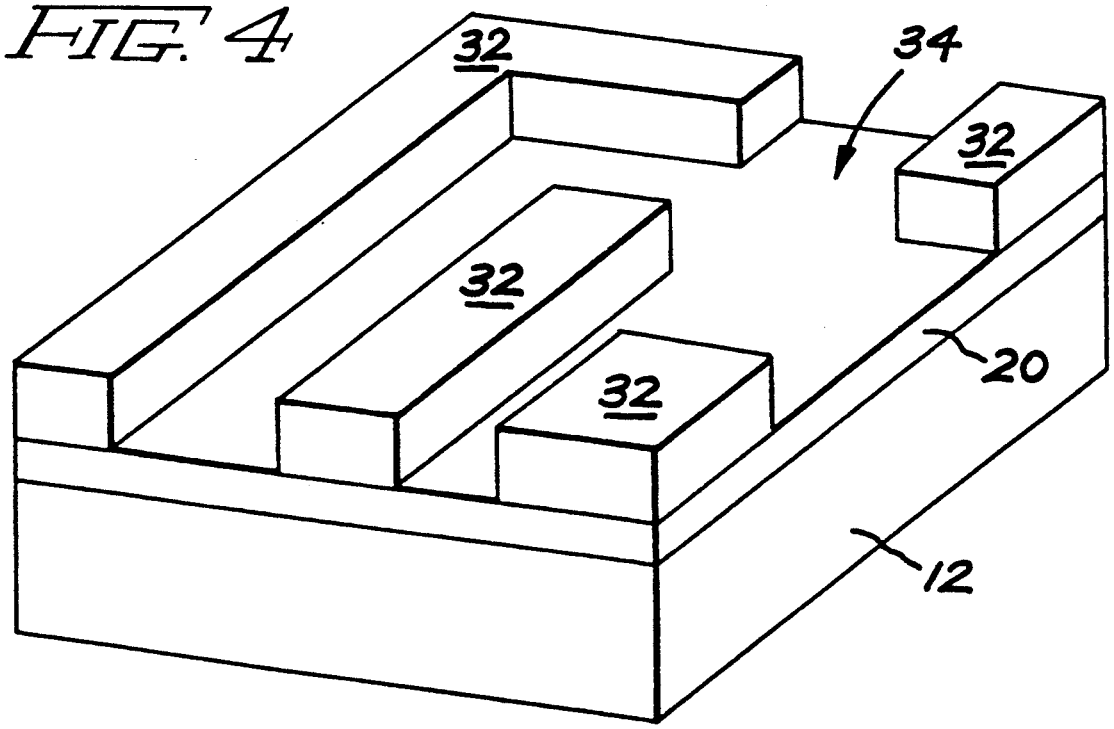

PATTERNING OF INDIUM-TIN OXIDE VIA SELECTIVE REACTIVE ION ETCHING

RELATED APPLICATION

This application is a continuation in part of application Ser. No. 07/542,624, filed Jun. 25, 1990 now abandoned.

BACKGROUND OF THE INVENTION

1. Field of the Invention

The present invention relates to the field of patterning indium-tin oxide films, and more particularly, to the patterning of such films by plasma etching.

2. Background Information

Indium-tin oxide, also known as ITO, is widely used in the electronics industry as a transparent electrode. It has particular application in liquid crystal displays where one of the electrodes which controls the state of the display is disposed between the viewer and the liquid crystal material. It is also used where a transparent electrode is needed in a solid state imager where that electrode is disposed between the light sensitive portion of the structure and the source of the light.

It is known that indium-tin oxide can be wet etched using hydrochloric acid, however, such etching of indium-tin oxide is not widely used because the HCl tends to undercut the photoresist mask pattern while it is etching the indium-tin oxide with the result that poor resolution is obtained.

It is also known to etch indium-tin oxide films in a plasma containing chlorine ions or other halogenated ions. This process does not suffer from the undercutting and occasional residual conductive spots which are characteristic of wet etching processes for etching indium-tin oxide.

It is well known in the electronics arts that etching processes which are used to pattern a layer on top of a substrate, must either not etch the substrate material or must etch the substrate material at a much slower rate than they etch the material being patterned. This is in order to ensure that the etching process can be reliably stopped at a point where the etching of the material being patterned has gone to completion, and the substrate is still unaffected or has been only minimally affected by the etching process. An etchant which has this characteristic is referred to as a selective etchant. It is generally accepted that, for etch stop purposes, a selective etchant must etch the material it is desired to remove at least five times faster than it etches the underlying material it is desired to leave in place. A preferred selective etchant is one which is selective for the material to be patterned and against all other materials which it may be desired to have underneath that material-to-be-patterned.

Indium-tin oxide, in electronic applications, typically is disposed on a substrate whose exposed surface includes one or more of silicon, molybdenum, aluminum, titanium, silicon nitride, silicon oxide (typically silicon dioxide), which it is desired to retain in the final structure. Thus, to be truly selective in electronics applications, an etchant for indium-tin oxide would have to leave all of these materials essentially undisturbed. In a HCl plasma, silicon etches essentially ten times faster than indium-tin oxide; molybdenum etches more than six times faster than indium-tin oxide; aluminum etches at essentially two-thirds the rate of indium-tin oxide; silicon oxide and silicon nitride each etch at substantially one-half the rate at which indium-tin oxide etches and titanium etches at substantially one-third the rate at which indium-tin oxide etches. Use of other halogenated etchants results in similar non-selective etching of indium-tin oxide. Even when a halogenated etchant contains a source of organic radicals, the much faster etch rates of the halogenated compounds predominate and substantially no etching results from the interaction of organic radicals and the metal being etched.

Accordingly, plasma etching of indium-tin oxide using halogenated gases is not a desirable process in the electronics arts where any one of these materials underlies the indium-tin oxide.

It has been reported in the literature that indium and tin can be individually etched in discharges containing methane or acetone. In each of these cases, the effective etching species is assumed to be the methyl radical. Unfortunately, this process results in the deposition of carbon containing films, typically polymers, on all exposed surfaces in the reactor which do not etch in the discharge. This is undesirable from a number of viewpoints. First, it results in the formation of undesired layers on the remainder of the component being etched. Such additional layers would have to be removed as part of the process of forming the device being produced. Second, the formation of these films on the surface of the reactor is undesirable because of the potential to contaminate other devices being etched in the reactor with other plasma compositions. Third, film deposition on the chamber surfaces necessitates frequent cleaning, leading to a loss of productivity. Because of these etching characteristics, this chemistry is not used in the electronics arts to pattern indium-tin oxide.

As a consequence, an alternative process known as lift-off is used to pattern indium-tin oxide films. In the lift-off process, a photoresist layer is deposited on the substrate and patterned with a re-entrant profile to expose the underlying substrate in those locations where the indium-tin oxide film is desired. The indium-tin oxide film is then deposited over that structure, which includes the exposed portions of the substrate and the remaining photoresist. After the desired thickness of the indium-tin oxide film has been deposited, the remaining photoresist is removed from the substrate using a solvent in which the photoresist is soluble, leaving in place that portion of the indium-tin oxide which was deposited directly on the substrate surface. While this lift-off process is generally effective for small areas, it becomes cumbersome and less reliable where large areas of patterned ITO film are required as in large area liquid crystal displays. This is because the photoresist dissolves at the edge of the substrate and then progressively inward. This lift-off process also has a disadvantage in that the presence of the photoresist prevents the use of an effective back sputtering immediately before ITO deposition to clean the substrate surface to remove incidental surface films such as air reaction oxides, oils or other low concentration contaminants which increase the resistance of the ITO-to-substrate contacts.

For large area structures and where finer detail is also required, an improved process for patterning indium-tin oxide is needed.

OBJECTS OF THE INVENTION

Accordingly, a primary object of the present invention is to provide a process for etching indium-tin oxide which is selective to common electronics materials such as silicon, molybdenum, aluminum, silicon oxide, silicon nitride and titanium.

Another object of the present invention is to provide a two-step process for selectively etching indium-tin oxide in which the first etching step uses an initial etchant which is not sufficiently selective with respect to other common electronics materials, but which relatively rapidly etches the indium-tin oxide, and in which a second etching step uses a final etchant which is slower in etching indium-tin oxide, but which is substantially selective with respect to other common electronics materials.

Another object of the present invention is to provide a method of etching indium-tin oxide in a non-halogenated organic-radical-containing plasma without depositing films on non-etching portions of the electronic component or the reactor.

Another object of the present invention is to provide an organic radical plasma etching process which does not result in film deposition on non-etching surfaces.

SUMMARY OF THE INVENTION

The above and other objects which will become apparent from the specification as a whole, including the drawings, are achieved in accordance with the present invention by etching indium-tin oxide in a plasma lacking halogenated gases which contains oxidizing ions and organic radicals, derived from a non-halogenated source, which are capable of reacting with the indium-tin oxide to produce volatile metalIorganic compounds. The relative concentrations of the oxidizing ions and the organic radicals is selected to be effective for etching the indium-tin oxide and preventing the deposition of films on non-etching portions of the component being etched and on the surface of the reactor.

Methane or acetone may preferably serve as the non-halogenated source of the organic radicals and oxygen may preferably serve as the oxidizing agent. This plasma also preferably includes argon in order to increase ion bombardment of the component being etched in order to accelerate the etching rate. Where acetone and oxygen are the sources of the organic radicals and the oxidizing agent, respectively, the partial pressure of the oxygen source gas is preferably greater than about 75% of the partial pressure of the acetone. This is an effective etching composition in that it etches ITO without depositing films on the non-etching portions of the structure. A partial oxygen pressure of substantially 75% of the acetone partial pressure is preferred because that provides the fastest etching rate which does not cause film deposition.

This plasma etching system etches indium-tin oxide at a relatively slow rate, but substantially eight times faster than any of the other common electronics materials.

A preferred process for etching indium-tin oxide comprises initially etching the indium-tin oxide in a chlorinated plasma to relatively rapidly remove indium-tin oxide until only a thin layer of the indium-tin oxide remains to be removed from the substrate. This chlorinated etch must be stopped before the substrate is exposed because of the relatively high rate at which it etches other common electronics materials. Thereafter, the remainder of the indium-tin oxide which is to be removed in the process of patterning that indium-tin oxide, is etched in the above-described organic-radical-/oxidizing agent containing plasma.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 1–6 illustrate successive steps in the process of depositing and patterning an indium-tin oxide film in accordance with the present invention.

DETAILED DESCRIPTION

Figure 1:
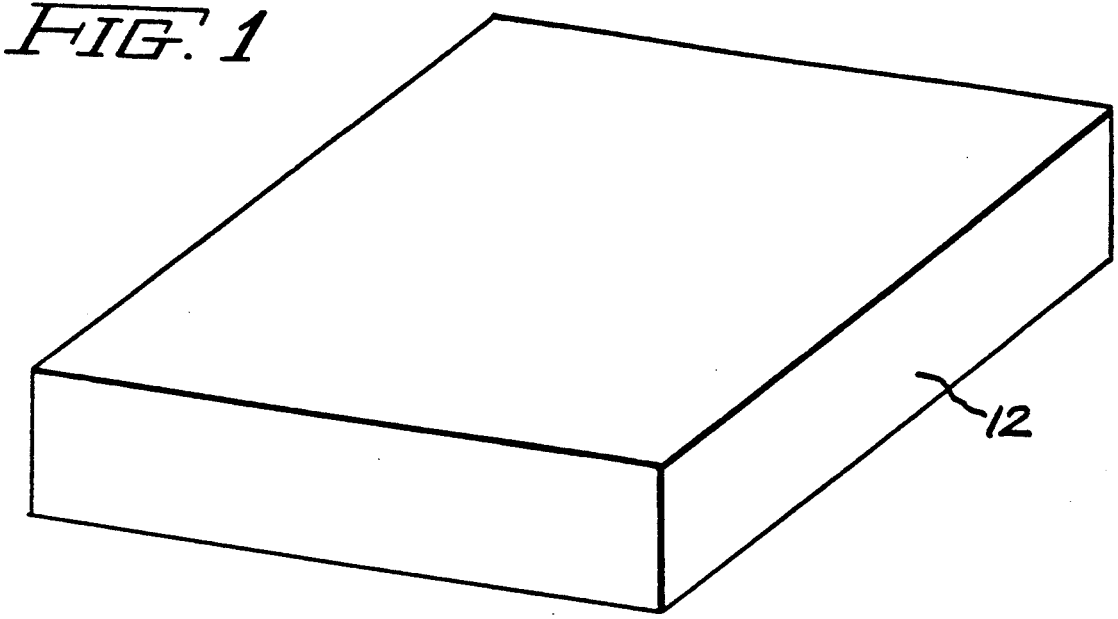
Figure 2:
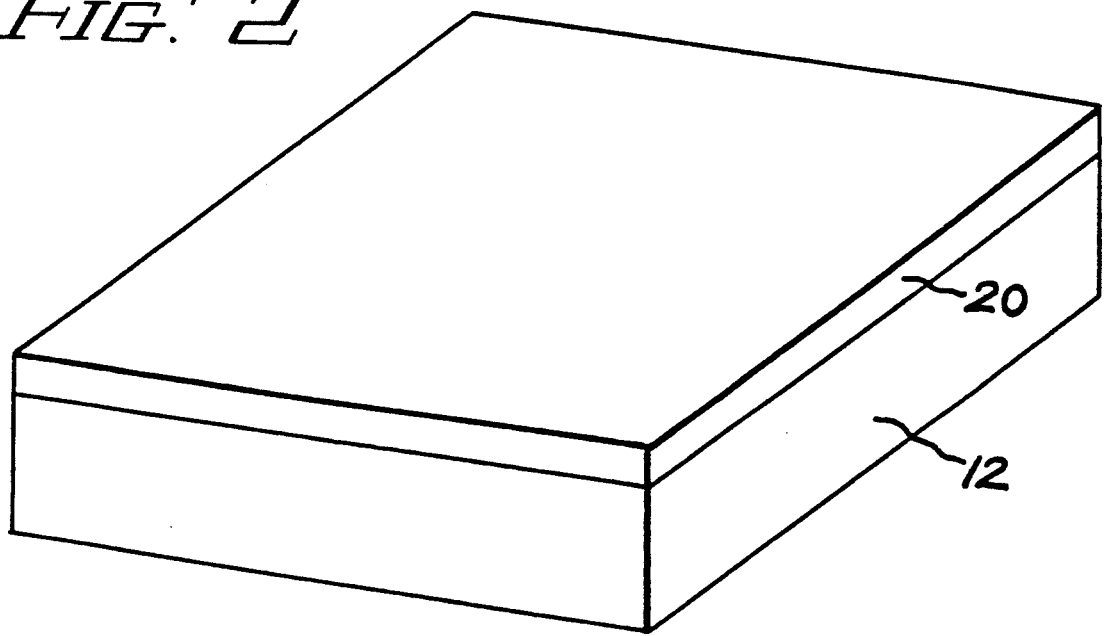

FIG. 1 is a perspective illustration of an electronic substrate 12 on which it is desired to form a patterned indium-tin oxide layer. The substrate 12 will typically include a variety of electronic structures which, depending upon the application, may include transistors, including amorphous silicon transistors in the case of liquid crystal displays, and other components as may be considered desirable, such as light emitting or light sensitive areas. An indium-tin oxide film is preferably deposited on this substrate in a sputtering system by briefly back sputtering the surface of the substrate 12 to clear the surface of any contaminants, including thin incidental oxide films formed as a result of exposure of the substrate 12 to air. Then, without breaking vacuum in the system, indium-tin oxide is sputtered on the substrate 12 in a known way until, as illustrated in FIG. 2, a layer 20 of indium-tin oxide of desired thickness has been formed over the entire upper surface of the substrate.

The substrate, with its indium-tin oxide film, is then removed from the sputtering apparatus and provided with a coating of photoresist 30, as illustrated in FIG. 3. Any appropriate photoresist may be employed, either one which is spun on as a liquid or one which is laminated as a sheet. Either positive or negative photoresists may be used in accordance with the desired method of exposure and development.

The photoresist layer 30 is then exposed to actinic light either through a mask or by direct writing with a laser beam or other tightly focused light source. The exposed photoresist is then developed in its appropriate developer to provide the structure shown in FIG. 4 in which portions 32 of the photoresist have been retained on top of the indium-tin oxide film and a window 34 has been opened in the photoresist.

Figure 5:
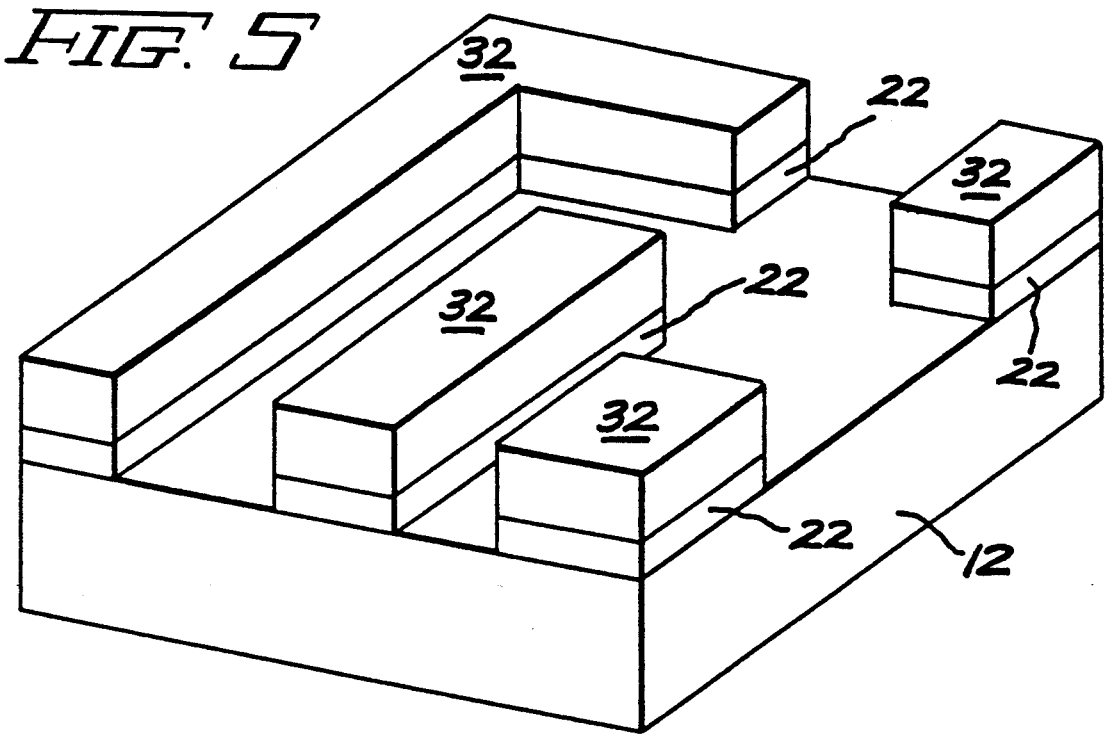
Figure 6:
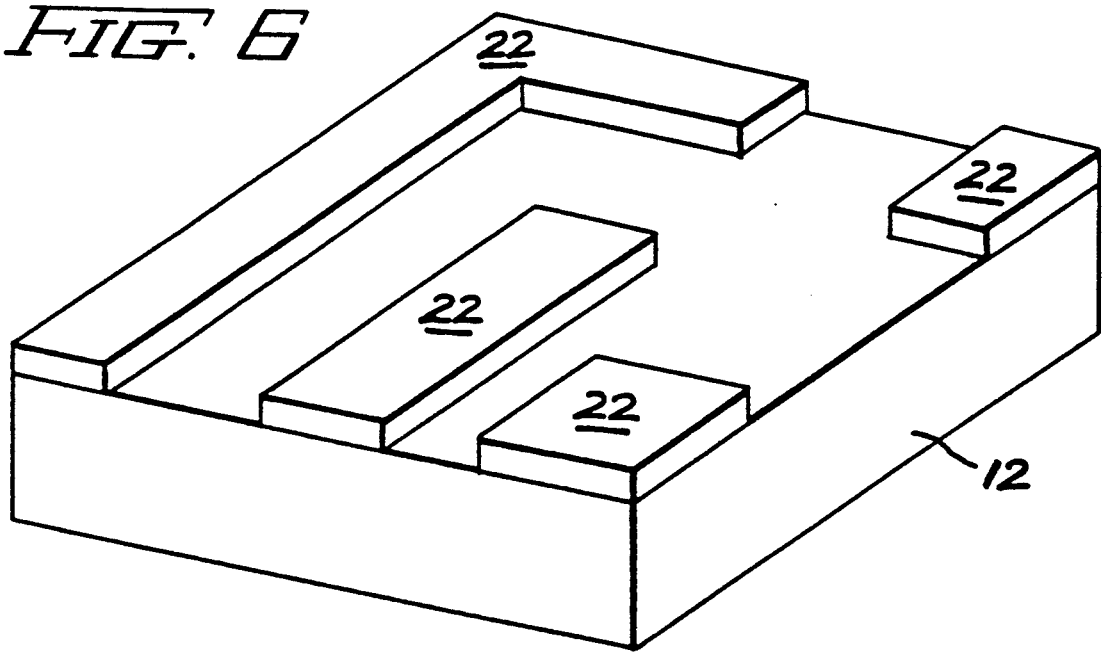

The structure illustrated in FIG. 4 is then inserted in a plasma etching reactor, the reactor is sealed and purged in its normal manner and a gas mixture comprising a source of oxidizing ions and a non-halogenated source of organic radicals which are capable of reacting with indium-tin oxide to produce volatile metal organic compounds are introduced into the reactor, preferably along with an inert gas such as argon. The source of oxidizing ions is preferably oxygen gas. The plasma discharge is then initiated to produce the organic radicals and oxidizing ions. Where the organic radicals strike the indium-tin oxide layer, they react with the indium-tin oxide to produce volatile metalIorganic compounds which are carried away from the substrate 12 by the flowing gas in the plasma reactor. Where the organic radicals strike the photoresist 32 or other surfaces within the reactor, they have, in the prior art, resulted in deposition of a film. Such deposition is prevented in accordance with the present invention by the presence of the oxygen in a relative concentration which is sufficient to prevent the deposition of organic material on any of the surfaces within the reactor. This etching is continued until the indium-tin oxide has been completely removed within the window 34 to provide the structure illustrated in FIG. 5 in which the indium-tin oxide portions 22, which are protected by the retained photoresist portions 32, are retained on the substrate 12. Thereafter, the retained photoresist 32 is removed from the substrate 12 by dissolving it in an appropriate solvent or by exposure to oxygen atoms in a plasma, to leave the structure illustrated in FIG. 6 in which a patterned indium-tin oxide film 22 is disposed on the substrate 12.

This plasma etching process avoids the problems of undercutting which are experienced with wet etching and avoids the problem of overetching the substrate 12 which is inescapable in the prior art processes where the common electronic materials silicon, molybdenum, aluminum, silicon oxide, silicon nitride or titanium are present as part of the exposed surface of the substrate 12 prior to the deposition of the indium-tin oxide.

Further, good electrical contact is provided between the retained indium-tin oxide and the underlying conductive materials of the substrate 12. This is in contrast to the photoresist lift-off process used in the prior art, in which back sputtering of the substrate prior to the deposition of the indium-tin oxide cannot be performed because the back sputtering would release organic materials from the photoresist layer which would contaminate the reactor and would also deposit on the "exposed" portions of the substrate, thereby defeating the purpose of the back sputtering operation.

Figure 7:
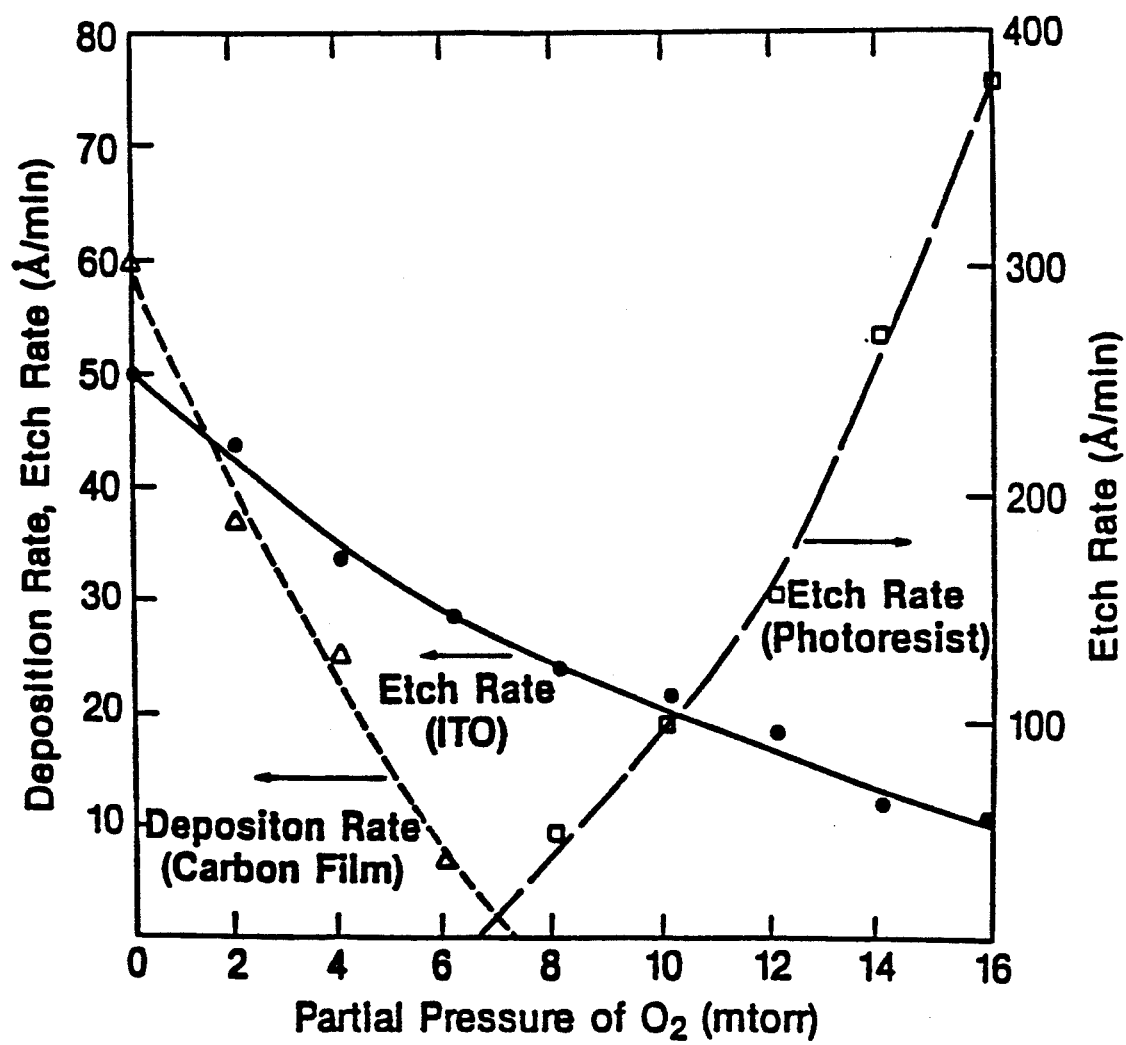
FIG. 7 is a graph showing the effect of relative partial pressures of oxygen and acetone on ITO etching, photoresist etching and film deposition.

FIG. 7 is a graph illustrating the etch rate of photoresist, the deposition rate of a carbon film and the etch rate of indium-tin oxide in a plasma in accordance with the present invention as a function of the partial pressure of oxygen for a constant partial pressure of acetone (10 mtorr). It will be observed from the graph that for an oxygen partial pressure of greater than about 7.5 mtorr, there is no deposition of a carbon film. Since the etch rate of photoresist goes up with increasing oxygen partial pressure and the etch rate of indium-tin oxide goes down with increasing oxygen partial pressure, the minimum oxygen partial pressure which ensures the prevention of a deposition of a carbon film is the preferred oxygen partial pressure. It will be observed that this oxygen partial pressure is roughly 75% of the acetone partial pressure.

In the data on which FIG. 7 is based, the argon partial pressure was decreased as the oxygen partial pressure was increased in order to keep the total pressure in the reactor constant. Table 1 shows the partial pressures used to obtain the data illustrated in FIG. 7. The FIG. 7 data was taken by etching a different sample in each of the indicated plasmas and then measuring the thickness decrease for the ITO film after a fixed etching time of 15 minutes. The thickness decrease for the photoresist was measured in the same way. The actual thickness of any deposited film was measured directly and converted to a constant growth rate which would have produced that thickness in the 15 minute etch time.

TABLE 1

| Pressure $C_3H_6O$ (mtorr) | Pressure $O_2$ (mtorr) | Pressure Ar (mtorr) | Pressure Total (mtorr) |
|---|---|---|---|
| 10 | 0 | 30 | 40 |
| 10 | 2 | 28 | 40 |
| 10 | 4 | 26 | 40 |
| 10 | 6 | 24 | 40 |
| 10 | 8 | 22 | 40 |
| 10 | 10 | 20 | 40 |
| 10 | 12 | 18 | 40 |
| 10 | 14 | 16 | 40 |
| 10 | 16 | 14 | 40 |

The use of the minimum oxygen is also desirable from the point of view of minimizing the quantity of photoresist required for the selective patterning. An appropriate gas mixture for use in this process is 20% to 40% acetone, 35% to 50% argon and 15% to 30% oxygen.

While FIG. 7 and Table 1 are specific to acetone, it will be understood that other non-halogenated organic gases may be used as a source of the organic radicals in the etching plasma. For example, ethanol, propanol, or butanone can be used in this process as the source of organic radicals. Naturally, the relative partial pressure of oxygen and other organic gases will generally be different than the desirable values for the acetone/oxygen system. However, the preferred relative pressures can easily be determined by taking data on such a gas system in the same manner as the FIG. 7 data was taken. Consequently, this invention is applicable to any non-halogenated source gas for the organic radicals which provides effective etching of the indium-tin oxide.

Table 2 lists the etch rate in angstroms per minute for a variety of electronic materials, in the acetone/argon/oxygen system in accordance with the present invention in the center column and in a hydrogen chloride plasma in the right-hand column.

TABLE 2

| | (A) $C_3H_6O/Ar/O_2$ plasma (Å/min.) | (B) HCl plasma (Å/min) |
|---|---|---|
| ITO | 25 | 60 |
| $SiO_2$ | 2 | 30 |
| $Si_2N_3$ | 2 | 30 |
| Ti | 0 | 20 |
| Mo | 0 | 400 |
| Al | 2 | 40 |
| Si | 3 | 600 |
| Resist | 80 | 600 |

As can be seen from Table 2, a hydrogen chloride plasma etches silicon ten times faster than it etches indium-tin oxide, etches molybdenum six and two thirds times faster than it etches indium-tin oxide, etches aluminum two thirds as fast as it etches indium-tin oxide, etches silicon oxide and silicon nitride one-half as fast as it etches indium-tin oxide and etches titanium one-third as fast as it etches indium-tin oxide. Such relative etch rates are considered unacceptable in the electronics arts where any of these other materials are disposed directly under the indium-tin oxide which is to be removed in an etching process, since it is not possible to ensure that all of the indium-tin oxide it is desired to remove has been removed, while at the same time ensuring that the underlying materials are not excessively etched. In contrast, in the plasma of the present invention indium-tin oxide etches eight and one-third times faster than silicon (the smallest difference in rates), twelve and one-half times faster than aluminum, silicon oxide and silicon nitride. The plasma of the present invention essentially does not etch titanium and molybdenum.

The relative etch rates between the indium-tin oxide and the photoresist are more favorable in the plasma in accordance with the present invention, but are not considered a serious problem in either etchant since a sufficiently thick photoresist layer may be added on top of the indium-tin oxide layer to ensure that the photoresist will remain intact throughout the etching process.

It is noted that indium-tin oxide etches 2.4 times faster in the hydrogen chloride plasma than it does in the acetone/oxygen plasma. Consequently, in order to minimize etching time, it is preferred to etch the indium-tin oxide in a hydrogen chloride or similar plasma until only a relatively thin layer of indium-tin oxide is left to be removed from the substrate. The plasma is then preferably changed to the acetone/oxygen plasma or similar suitable non-halogenated mixture to complete the etching because of the self-terminating nature of the etching in the acetone/oxygen plasma.

It will be recognized that inert gases other than argon, such as nitrogen, can be used in the plasma gas source to provide additional ion bombardment of the structure being etched. While a reactive ion etching (RIE) apparatus is preferred for use with the invention, it should be understood that a standard plasma system may also be employed.

While this plasma etchant composition has been described in terms of its effect with ITO films it will be recognized that it will also be effective with other materials, including indium and tin individually and the respective oxides of these elements, whose reactants form volatile metallorganic compounds. Thus, the utility of this etchant composition and process is not limited to ITO.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. In a method of etching indium-tin oxide by masking the indium-tin oxide to leave it exposed in the areas it is desired to remove, the improvement comprising:
    etching said indium-tin oxide in a plasma lacking halogenated gases and including an oxidizing agent and a non-halogenated source of organic radicals which react with said indium-tin oxide to form volatile metallorganic compounds, said oxidizing agent and said organic radicals being present in relative concentrations which prevent deposition of a carbonaceous film on non-indium-tin oxide portions of said structure.

2. The improvement recited in claim 1 wherein:
    said oxidizing agent is oxygen.

3. The improvement recited in claim 2 wherein:
    some of said organic radicals are derived from acetone.

4. The improvement recited in claim 3 wherein:
    said plasma further comprises ions of an inert gas.

5. The improvement recited in claim 4 wherein:
    said inert gas is selected from the group consisting of nitrogen and argon.

6. The improvement recited in claim 1 wherein said organic radicals comprise methyl radicals.

7. The improvement recited in claim 1 wherein:
    said plasma is derived from a gas mixture comprising acetone, argon and oxygen.

8. The improvement recited in claim 7 wherein:
    said acetone comprises between 20% and 40% of said gas mixture;
    said argon comprises between 35% and 50% of said gas mixture; and
    said oxygen comprises between 15% and 30% of said gas mixture.

9. The improvement recited in claim 8 wherein:
    said oxygen is present at a partial pressure between 75% and 80% of the partial pressure of said acetone.

10. The improvement recited in claim 9 wherein:
    said oxygen partial pressure is substantially 75% of the acetone partial pressure.

11. The improvement recited in claim 1 wherein:
    said indium-tin oxide is to be completely removed in the areas from which it is to be removed and the material exposed by complete removal of said indium-tin oxide comprises at least one of silicon oxide, silicon nitride, titanium, molybdenum, aluminum and silicon.

12. In a method of selectively etching indium-tin oxide by masking the indium-tin oxide to leave it exposed in areas from which it is desired to remove said indium-tin oxide, the improvement comprising:
    initially etching said exposed indium-tin oxide in a first etchant to remove a significant portion of the indium-tin oxide to be removed; and
    further etching said indium-tin oxide in a plasma lacking halogenated gases and including an oxidizing agent and a non-halogenated source of organic radicals which react with said indium-tin oxide to form volatile metallorganic compounds, said oxidizing agent and said organic radicals being present in relative concentrations which prevent deposition of carbonaceous material on non-indium-tin oxide portions of said structure to expose the material underlying the indium-tin oxide being removed.

13. The improvement recited in claim 12 wherein:
    said initial etching is performed in a plasma comprising chlorine ions.

14. The improvement recited in claim 13 wherein:
    said chlorine ions are derived from a chlorinated gas.

15. The improvement recited in claim 14 wherein:
    said chlorinated gas comprises one or more of $Cl_2$, HCl and $CCl_4$.

16. The improvement recited in claim 14 wherein:
    said plasma further comprises ions of an inert gas.

17. The improvement recited in claim 16 wherein:
    said inert gas is selected from the group consisting of nitrogen and argon.

18. The improvement recited in claim 13 wherein:
    said oxidizing agent is oxygen.

19. The improvement recited in claim 18 wherein:
    some of said organic radicals are derived from acetone.

20. A method of providing a pattern of indium-tin oxide coated areas on a substrate comprising the steps of:
    depositing an indium-tin oxide film directly on said substrate;
    masking said indium-tin oxide to leave it exposed in the areas it is desired to remove;

etching said indium-tin oxide in a plasma to expose the material underlying the indium-tin oxide being removed, said plasma lacking halogenated gases and including a non-halogenated source of organic radicals which react with said indium-tin oxide to form volatile metallorganic compounds and an oxidizing agent in relative concentrations which prevent deposition of carbonaceous material on non-indium-tin oxide portions of said structure.

21. The method recited in claim 20 wherein:
said organic radicals include methyl radicals.

22. The method recited in claim 20 further comprising, after said masking step and prior to said etching step, the step of:
partially etching said indium-tin oxide in a faster etching plasma.

23. A method of providing a pattern of indium-tin oxide coated areas on a substrate comprising the steps of:
depositing a indium-tin oxide film directly on said substrate;
masking said indium-tin oxide to leave it exposed in the areas where it is desired to remove said indium-tin oxide;
pre-etching said exposed indium-tin oxide in a first etchant to remove a significant portion of the indium-tin oxide to be removed; and
finish etching said indium-tin oxide in a plasma lacking halogenated gases and including organic radicals derived from a non-halogenated source and further including an oxidizing agent in relative concentrations which prevent deposition of carbonaceous material on non-indium-tin oxide portions of said structure to expose the material underlying the indium-tin oxide being removed; said plasma being capable of reacting with said indium-tin oxide to form volatile metallorganic compounds.

24. The improvement recited in claim 23 wherein:
said oxidizing agent is oxygen.

25. The improvement recited in claim 24 wherein:
some of said organic radicals are derived from acetone.

26. The improvement recited in claim 25 wherein:
said plasma further comprises ions of an inert gas.

27. The improvement recited in claim 26 wherein:
said inert gas is selected from the group consisting of nitrogen and argon.

28. A method of etching indium-tin oxide comprising:
inserting said indium-tin oxide in a plasma etching system;
providing non-halogenated source materials to create a plasma lacking halogenated gases and containing methyl radicals and oxidizing radicals; and
activating said plasma etching system to create a plasma containing methyl radicals and oxidizing radicals for a period of time sufficient to remove a desired quantity of said indium-tin oxide.

29. A method of etching indium-tin oxide comprising:
inserting said indium-tin oxide in a plasma etching system;
providing non-halogenated source materials to create a plasma lacking halogenated gases and containing oxidizing radicals and organic radicals with which said indium-tin oxide can form volatile metallorganic compounds; and
activating said plasma etching system to create a plasma containing said organic radicals and oxidizing radicals for a period of time sufficient to remove a desired quantity of said indium-tin oxide.

30. In a method of etching a metal oxide containing film in which the metal oxide is capable of forming volatile metallorganic compounds and in which the metal oxide containing film is masked to leave it exposed in those areas from which it is desired to remove said film, the improvement comprising:
etching said metal oxide containing film in a plasma lacking halogenated gases and including oxygen and a non-halogenated source of organic radicals comprising acetone which react with said metal oxide to form volatile metalorganic compounds, said oxidizing agent and said organic radicals being present in relative concentrations which prevent deposition of a carbonaceous film on surfaces which do not etch in said plasma.

31. The improvement recited in claim 30 wherein:
said plasma further comprises ions of an inert gas.

32. The improvement recited in claim 4 wherein:
said inert gas is selected from the group consisting of nitrogen and argon.

33. The improvement recited in claim 1 wherein:
said plasma is derived from a gas mixture comprising acetone, argon and oxygen.

34. The improvement recited in claim 1 wherein:
said metal oxide film comprises indium-tin oxide.

35. The improvement recited in claim 1 wherein:
said metal oxide film comprises indium oxide.

36. The improvement recited in claim 1 wherein:
said metal oxide film comprises tin oxide.

37. In a method of plasma etching a metal oxide, the improvement comprising:
providing non-halogenated source material to create a plasma lacking halogenated gases and comprising organic radicals and oxygen ions, said oxygen ions and said organic radicals being present in relative concentrations which prevent deposition of a carbonaceous film on surfaces which do not etch in said plasma, said source material comprising acetone and oxygen.

* * * * *